US008425977B2

(12) United States Patent
Merry et al.

(10) Patent No.: US 8,425,977 B2
(45) Date of Patent: Apr. 23, 2013

(54) SUBSTRATE PROCESSING CHAMBER WITH OFF-CENTER GAS DELIVERY FUNNEL

(75) Inventors: Nir Merry, Mountain View, CA (US); Son T. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 795 days.

(21) Appl. No.: 12/240,120

(22) Filed: Sep. 29, 2008

(65) Prior Publication Data

US 2010/0080904 A1    Apr. 1, 2010

(51) Int. Cl.
    *C23C 16/455*    (2006.01)
(52) U.S. Cl.
    USPC ........................................ 427/248.1; 118/715
(58) Field of Classification Search ............ None
    See application file for complete search history.

(56) References Cited

U.S. PATENT DOCUMENTS

| | | | | |
|---|---|---|---|---|
| 4,948,458 A * | 8/1990 | Ogle | | 438/729 |
| 5,521,126 A * | 5/1996 | Okamura et al. | | 438/789 |
| 6,153,260 A * | 11/2000 | Comita et al. | | 427/255.23 |
| 6,812,157 B1 | 11/2004 | Gadgil | | |
| 2002/0092618 A1* | 7/2002 | Collins | | 156/345.48 |
| 2002/0125239 A1* | 9/2002 | Chen et al. | | 219/444.1 |
| 2003/0017268 A1* | 1/2003 | Hu et al. | | 427/255.391 |
| 2003/0079686 A1* | 5/2003 | Chen et al. | | 118/715 |
| 2005/0223986 A1* | 10/2005 | Choi et al. | | 118/715 |
| 2005/0263070 A1* | 12/2005 | Fink | | 118/715 |
| 2006/0219361 A1 | 10/2006 | Wang et al. | | |
| 2006/0281310 A1 | 12/2006 | Smith et al. | | |
| 2007/0090091 A1 | 4/2007 | Adomaitis | | |
| 2007/0148349 A1 | 6/2007 | Fukada | | |

FOREIGN PATENT DOCUMENTS

| | | |
|---|---|---|
| JP | 05343327 A | 12/1993 |
| WO | 2005088692 A1 | 9/2005 |

OTHER PUBLICATIONS

International Search Report and Written Opinion mailed Apr. 29, 2010 for PCT Application No. PCT/US2009/058557.

* cited by examiner

*Primary Examiner* — Joseph Miller, Jr.
(74) *Attorney, Agent, or Firm* — Moser Taboada; Alan Taboada

(57) ABSTRACT

Methods and apparatus for processing substrates are disclosed herein. The process chamber includes a chamber body, a substrate support pedestal, a pump port and a gas injection funnel. The chamber body has an inner volume and the substrate support pedestal is disposed in the inner volume of the chamber body. The pump port is coupled to the inner volume and is disposed off-center from a central axis of the substrate support pedestal. The pump port provides azimuthally non-uniform pumping proximate to a surface of the substrate support pedestal and creates localized regions of high pressure and low pressure within the inner volume during use. The gas injection funnel is disposed in a ceiling of the chamber body and opposite the substrate support pedestal. The gas injection funnel is offset from the central axis of the substrate support pedestal and is disposed in a region of low pressure.

18 Claims, 3 Drawing Sheets

US 8,425,977 B2

SUBSTRATE PROCESSING CHAMBER WITH OFF-CENTER GAS DELIVERY FUNNEL

FIELD

Embodiments of the present invention generally relate to semiconductor processing chamber and, more particularly, to a method and apparatus for providing improved uniformity in layers deposited on a substrate.

BACKGROUND

As the size of features in semiconductor devices continue to shrink, there is a continuing need to improve quality of the individual deposited layers comprising a semiconductor device. Some quality problems, for instance, uniformity of a layer across a substrate can be attributed to the geometry of the process chamber in which the layer is formed or processed. For example, pump ports are often disposed asymmetrically with respect to the chamber volume, which can result in azimuthally non-uniform pumping proximate the surface of a substrate being processed. A process gas being supplied to the substrate via a gas inlet disposed centrally above a substrate support is often distributed non-uniformly across the substrate surface, having thinner deposition proximate the pumping port.

Many techniques, for example, Physical Vapor Deposition, Chemical Vapor Deposition and Atomic Layer Deposition (ALD) are well known for the fabrication of devices using thin layers. The ALD technique deposits extremely thin coatings on the substrate surface. As such, ALD techniques are especially susceptible to non-uniform distribution of process gas causing non-uniform layer deposition.

Thus, there is a need in the art for an improved process chamber for providing improved uniformity in the distribution of a process gas across the surface of a substrate.

SUMMARY

A method and apparatus for processing a substrate are provided herein. In some embodiments, the apparatus includes a process chamber defining an inner volume and having a substrate support pedestal disposed therein; a pump port coupled to the inner volume and disposed off-center from a central axis of the substrate support pedestal, wherein the pump port provides azimuthally non-uniform pumping proximate a surface of the substrate support pedestal creating localized regions of high pressure and low pressure within the inner volume during use; and a gas injection funnel disposed in a ceiling of the process chamber opposite the substrate support pedestal, wherein the gas injection funnel is offset from the central axis of the substrate support pedestal and disposed in a region of low pressure.

In some embodiments, a method of depositing a layer of material on a semiconductor substrate includes placing a substrate on a substrate support pedestal disposed in an inner volume of a process chamber having one or more pump ports disposed off-center from the substrate support pedestal, wherein the one or more pump ports provide azimuthally non-uniform pumping proximate a surface of the substrate support pedestal creating localized regions of high pressure and low pressure within the inner volume; and providing a first process gas to the inner volume via a gas injection funnel disposed in a ceiling of the chamber body opposite the substrate support pedestal, wherein the gas injection funnel is offset from a central axis of the substrate support pedestal and disposed in a region of low pressure and wherein the first process gas at least partially forms a layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Methods and apparatus for processing a substrate are provided herein. In some embodiments, the apparatus includes a process chamber defining an inner volume and having a substrate support pedestal disposed therein; a pump port coupled to the inner volume and disposed off-center from a central axis of the substrate support pedestal, wherein the pump port provides azimuthally non-uniform pumping proximate a surface of the substrate support pedestal creating localized regions of high pressure and low pressure within the inner volume during use; and a gas injection funnel disposed in a ceiling of the chamber body opposite the substrate support pedestal, wherein the gas injection funnel is offset from the central axis of the substrate support pedestal and disposed in a region of low pressure. The apparatus and accompanying method facilitate improved uniformity in deposited layers on the surface of a substrate.

Figure 1:
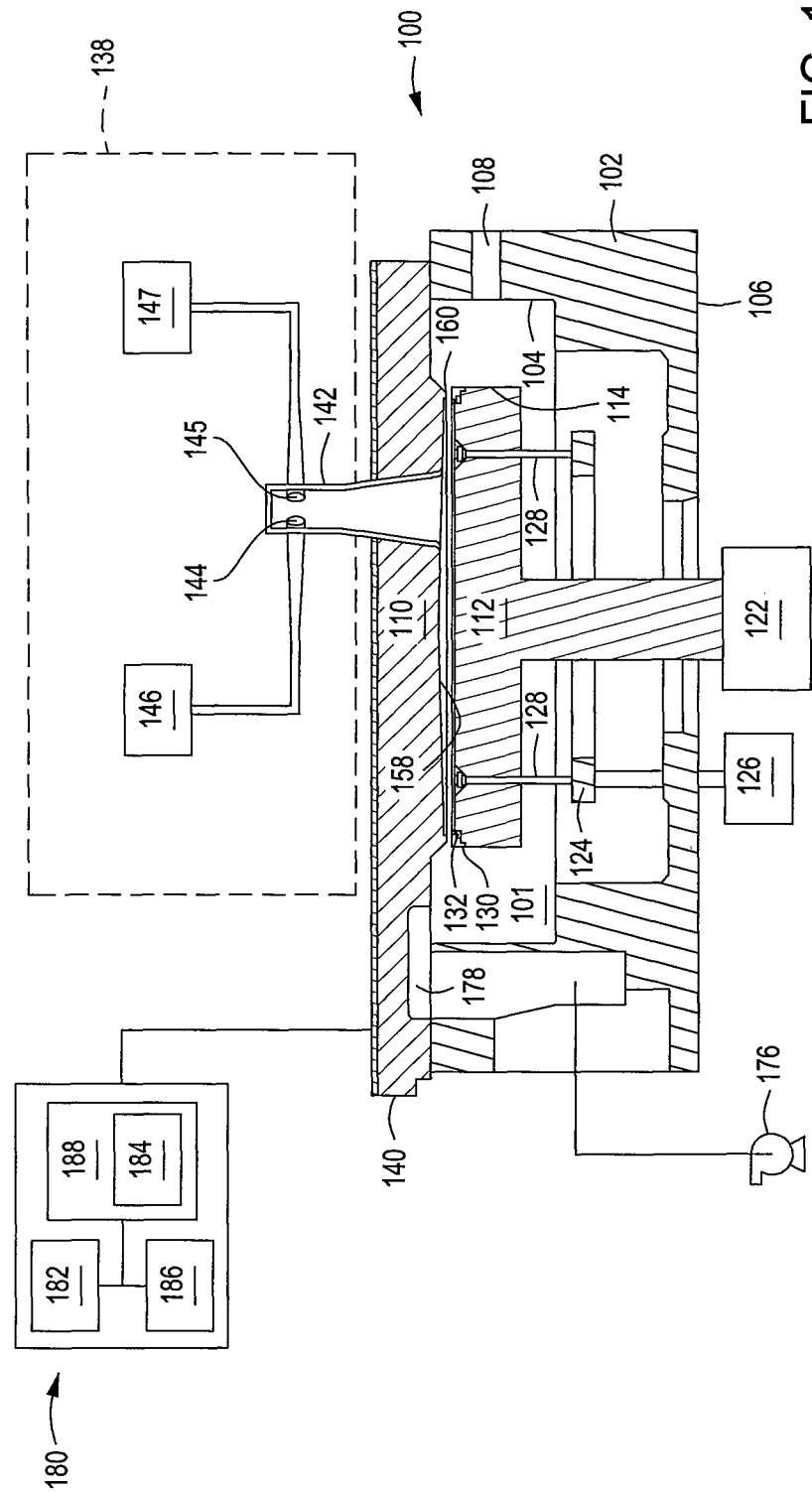
FIG. 1 depicts a schematic cross sectional view of one embodiment of a process chamber in accordance with the present invention.

FIG. 1 depicts a schematic cross-sectional view of an exemplary process chamber 100 in accordance with some embodiments of the present invention. The process chamber 100 may be adapted for a cyclic deposition, such as Atomic Layer Deposition (ALD) or Chemical Vapor Deposition (CVD). ALD and CVD used herein to facilitate sequential introduction of reactants to deposit a thin layer over a substrate structure. The sequential introduction of reactants may be repeated to deposit multiple thin layers to form a conformal layer of a desired thickness. The process chamber 100 may also be adapted for other deposition techniques, such as Plasma Enhanced-CVD (PE-CVD), Physical Vapor Deposition (PVD), Atomic Layer Epitaxy (ALE), or the like, or combinations thereof. One suitable process chamber that may be modified in accordance with the present invention is the GEMINI™ ALD chamber, available from Applied Materials, Inc.

The process chamber 100 comprises a chamber body 102 having an inner volume 101 with a substrate support pedestal 114 disposed therein. The chamber body 102 further comprises sidewalls 104 and a bottom 106. A slit valve 108 in the process chamber 100 provides access for a robot (not shown) to deliver and retrieve a substrate 110. The details of exemplary process chamber 100 are described in commonly assigned United States Patent Application Publication No. 2005-0271813, filed on May 12, 2005, entitled "Apparatuses and Methods for Atomic Layer Deposition of Hafnium-Containing High-K Dielectric Materials," and United States Patent Application Publication No. 20030079686, filed on Dec. 21, 2001, entitled "Gas Delivery Apparatus and Method For Atomic Layer Deposition," both of which are incorporated by reference herein.

A substrate support pedestal 114 supports the substrate 110 on a substrate receiving surface 112 in the process chamber 100. The substrate support pedestal 114 is mounted on a lift motor 122 to raise and lower the substrate support pedestal 114 and the substrate 110 disposed thereon. A lift plate 124, coupled to a lift motor 126, is mounted in the process chamber 100 and raises and lowers pins 128 movably disposed through the substrate support pedestal 114. The pins 128 raise and lower the substrate 110 over the surface of the substrate support pedestal 114. In some embodiments, the substrate support pedestal 114 may include a vacuum chuck, an electrostatic chuck, or a clamp ring for securing the substrate 110 to the substrate support pedestal 114 during processing. The lift motor 122, or alternatively located proximate the lift motor 122, is a mechanism for facilitating rotation of the substrate support pedestal 114 about a central axis during processing.

In some embodiments, the substrate support pedestal 114 may be heated to increase the temperature of the substrate 110 disposed thereon. For example, the substrate support pedestal 114 may be heated using an embedded heating element, such as a resistive heater, or may be heated using radiant heat, such as heating lamps disposed above the substrate support pedestal 114. In some embodiments, a purge ring 130 may be disposed on the substrate support pedestal 114 to define a purge channel 132. The purge channel 132 provides a purge gas to a peripheral portion of the substrate 110 to prevent deposition thereon.

A gas delivery apparatus 138 is disposed at an upper portion of the chamber body 102 to provide a gas such as a process gas, carrier gas or inert gas to the process chamber 100. A vacuum system 176 communicates with a pumping port 178 to evacuate any unwanted gases from the process chamber 100 and to help in maintaining a desired pressure or a desired pressure range inside the inner volume 101 of the process chamber 100. The pumping port 178 is asymmetrically disposed with respect to the inner volume 101 of the chamber body 102 and may provide azimuthally non-uniform pumping proximate the surface 112 of the substrate support pedestal 114.

The chamber 100, as depicted in FIG. 1, permits a gas to enter the process chamber 100 normal (i.e., 90 degree) with respect to the plane of the substrate 110 via a gas injection funnel 142. The gas delivery apparatus 138 further comprises a chamber lid 140. The chamber lid 140 includes the gas injection funnel 142 and a bottom surface 158 extending from the gas injection funnel 142 to a peripheral portion of the chamber lid 140. The chamber lid 140 acts as a ceiling of the chamber body 102. The bottom surface 158 is sized and shaped to substantially cover the substrate 110 disposed on the substrate support pedestal 114. The chamber lid 140 may have a choke 160 at a peripheral portion of the chamber lid 140 adjacent the periphery of the substrate 110.

The gas injection funnel 142 is disposed opposite the surface 112 of the substrate support pedestal 114 and offset from the central axis of substrate support pedestal 114. The gas injection funnel 142 may include one or more gas inlets, such as gas inlets 144, 145 for coupling the gas injection funnel 142 to one or more gas sources, such as gas sources 146, 147. It is further contemplated that other variants are possible, such as providing at least one of valves, mass flow controllers, or similar apparatus for controlling the flow of a gas between each gas source 146, 147 and each gas inlet 144, 145.

Referring to FIG. 1, at least a portion of the bottom surface 158 of the chamber lid 140 may be tapered from the gas injection funnel 142 to a peripheral portion of the chamber lid 140 to help in providing an improved velocity profile of the gas flow from the gas injection funnel 142 across the surface of the substrate 110. The bottom surface 158 may comprise one or more tapered surfaces, such as a straight surface, a concave surface, a convex surface, or combinations thereof. In some embodiments, the bottom surface 158 is tapered in the shape of a funnel.

A control unit 180, such as a programmed personal computer, work station computer, or the like, is coupled to the process chamber 100 to control various processing conditions. For example, the control unit 180 may be configured to control flow of gases from gas sources 146, 147. The control unit 180 may further be configured to control the rotation of the substrate 110 during processing.

The control unit 180 includes a Central Processing Unit (CPU) 182, support circuits 184, and a memory 186 having associated software routine 188. The Central Processing Unit 182 may be one of any form of general-purpose computer processor that can be used in an industrial setting for controlling various chambers and sub-processors. The memory, or computer-readable medium, 186 of the CPU 182 may be one or more of readily available memory such as Random Access Memory (RAM), Read Only Memory (ROM), floppy disk, hard disk, or any other form of digital storage, local or remote. The support circuits 184 are coupled to the CPU 182 for supporting the processor in a conventional manner. The support circuits include cache, power supplies, clock circuits, input/output circuitry and subsystems, and the like. The software routine 188, when executed, can perform embodiments of the inventive method 300, which is described below. The software routine 188 may also be stored and/or executed by a second CPU (not shown) that is remotely located from the hardware being controlled by the CPU 182.

FIGS. 2A-D depict schematic top views of the process chamber 100 in a accordance with embodiments of the present invention. FIGS. 2A-D further illustrate positioning of one or more gas injection funnels and one or more pump ports relative to the position of the substrate support pedestal. Generally, in the present invention, each gas injection funnel may be disposed in the ceiling of the chamber body opposite the substrate support pedestal, wherein the gas injection funnel is offset from a central axis of the substrate support pedestal and disposed in a region of low pressure. Each pump port may be coupled to the inner volume and disposed off-center from the central axis of the substrate support pedestal. Each pump port may provide azimuthally non-uniform pumping proximate a surface of the substrate support pedestal creating localized regions of high pressure and low pressure within the inner volume during use.

Figure 2A:
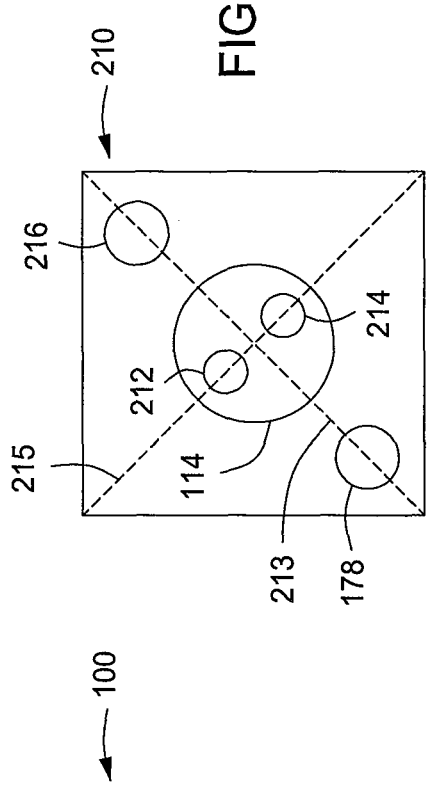
FIG. 2A-D depict schematic top views of embodiments of a process chamber in accordance with the present invention.

FIG. 2A depicts a schematic top view of the process chamber 100 in a accordance with one embodiment of the present invention. In the embodiment depicted in FIG. 2A, a central axis of each of the pump port 178, the gas injection funnel 142 and the substrate support pedestal 114 are disposed in a common plane. The gas injection funnel 142 and the pump port 178 are disposed opposite each other with respect to the central axis of the substrate support pedestal.

Figure 2C:
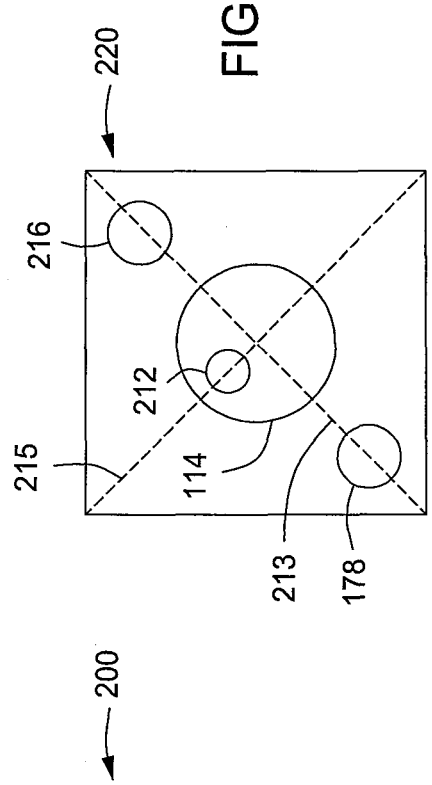
Figure 2B:
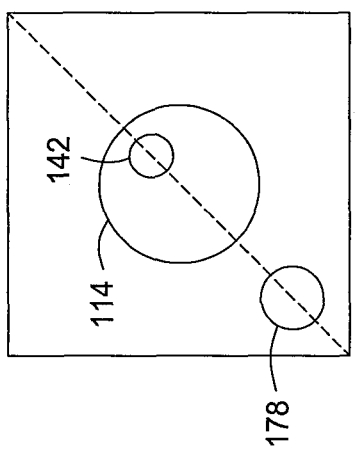

FIG. 2B depict a schematic top view of a process chamber 200 in a accordance with one embodiment of the present invention. The process chamber 200 includes the substrate support pedestal 114, the pump port 178, a first gas injection funnel 202 and a second gas injection funnel 204. In the embodiment depicted in FIG. 2B, the central axis of each of the pump port 178 and the substrate support pedestal 114 are disposed in a common plane, and the first and second gas injection funnels are disposed in regions of low pressure on opposing sides of the common plane. The pump port and each gas injection funnel 202, 204 are disposed on opposing sides with respect to the central axis of the substrate support pedestal 114. In some embodiments, the first and second gas injection funnels 202, 204 may be coupled to one or more common gas sources. (not shown). In some embodiments, the first and second gas injection funnels 202, 204 may be coupled to separate gas sources for supplying the same or different process gases.

In the configuration illustrated in FIG. 2B, the pump port 178 is disposed about equidistant from each funnel 202, 204. It is contemplated that the pump port can provide substantially similar azimuthally non-uniform pumping proximate a portion of the surface of the substrate support pedestal 114 disposed below each gas injection inlet 202, 204.

FIG. 2C depicts a schematic top view of a process chamber 210 in accordance with one embodiment of the present invention. The process chamber 210 includes the substrate support pedestal 114, the pump port 178, a second pump port 216, a first gas injection funnel 212 and a second gas injection funnel 214. In the embodiment depicted in FIG. 2C, a central axis of each of the pump port 178, the second pump port 216 and the substrate support pedestal 114 are disposed in a first common plane 213; and a central axis of the first and second gas injection funnels 212, 214 and the substrate support pedestal 114 are disposed in a second common plane 215. In FIG. 2C, and in some embodiments, the first and second common planes 213, 215 are perpendicular to each other. Further, as shown in FIG. 2C and in some embodiments, the pump port 178 and the second pump port 216 are disposed opposite each other with respect to the central axis of the substrate support pedestal 114; and the first and second gas injection funnels 212 and 214 are disposed opposite each other with respect to the central axis of the substrate support pedestal 114.

As discussed above, it is similarly contemplated here that the first and second gas injection funnels 212, 214 can be coupled to one or more common gas sources, or alternatively, each gas injection funnel 212, 214 can be coupled to a separate gas source for supplying the same or different process gases.

In the configuration illustrated in FIG. 2C, the pump port 178 and the second pump port 216 are disposed about equidistant from each funnel 202, 204. It is contemplated that each pump port can provide substantially similar azimuthally non-uniform pumping proximate a portion of the surface of the substrate support pedestal 114 disposed below each gas injection inlet 212, 214.

Figure 2D:
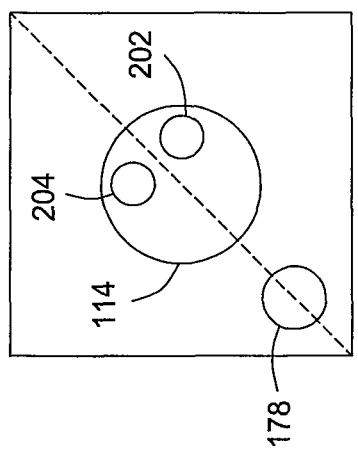

FIG. 2D depicts a schematic top view of a process chamber 220 in accordance with one embodiment of the present invention. The process chamber 220 includes the substrate support pedestal 114, the pump port 178, the second pump port 216, and the first gas injection funnel 212. In the embodiment depicted in FIG. 2D, a central axis of each of the pump port 178, the second pump port 216 and the substrate support pedestal 114 are disposed in the first common plane 213; and a central axis of the first gas injection funnel 212 and the substrate support pedestal 114 are disposed in the second common plane 215. In FIG. 2D, and in some embodiments, the first and second common planes 213, 215 are perpendicular to each other. Further, as shown in FIG. 2D and in some embodiments, the pump port 178 and the second pump port 216 are disposed opposite each other with respect to the central axis of the substrate support pedestal 114; and the first gas injection funnel 212 is disposed in a region of low pressure substantially equidistant from each pump port 178, 216.

Figure 3:
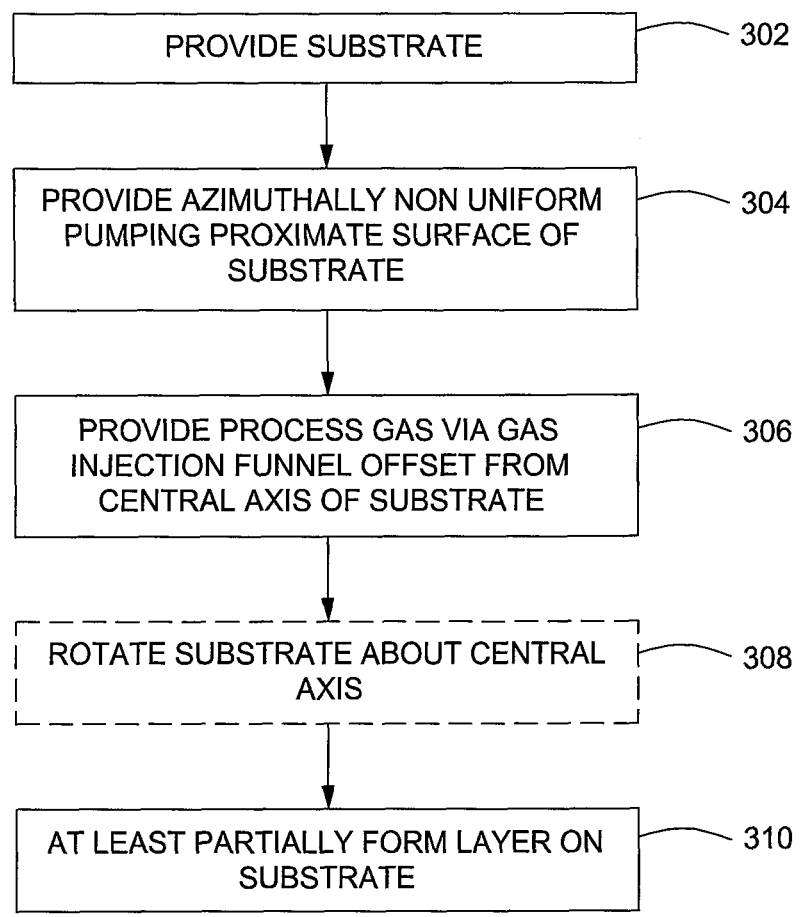
FIG. 3 depicts a flow chart of a method in accordance with some embodiments of the present invention.

FIG. 3 depicts a flow chart of a method 300 in accordance with some embodiments of the present invention. The method 300 is described below with respect to FIGS. 1 and 2A, however, the method 300 may be applied using any suitable embodiments of the process chambers described above. The method 300 begins at 302 by providing a substrate 110. Generally, a central axis of the substrate 110 is aligned with the central axis of the substrate support pedestal 114.

The substrate 110 is disposed in the process chamber 100 having a pump port 178 disposed off-center from the substrate substrate support pedestal 114 and a gas injection funnel 142 disposed in the ceiling of the process chamber 100 opposite the substrate support pedestal 114. The gas injection funnel 142 is offset from the central axis of the substrate support pedestal 114 and disposed in region of low pressure.

The substrate 110 may be any substrate or material surface upon which film processing is performed. For example, the substrate 110 may be a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. The substrate 110 may have various dimensions, such as 200 mm or 300 mm diameter wafers, as well as rectangular or square panels.

At 304, the pump port 178 provides azimuthally non uniform pumping is provided to proximate the surface of the substrate 110 and substrate support pedestal 114. The azimuthally non uniform pumping generally provides high pressure regions proximate the pump port 178 and low pressure regions away from the pump port 178. In the absence of correction, the inventors have discovered that azimuthally non uniform pumping results in a thinner deposition of a process gas on a portion of the substrate 110 proximate the pump port 178.

At 306, a process gas is provided via the gas injection funnel 142. The gas injection funnel 142 may be purposefully offset from the central axis of the substrate support pedestal 114 and opposing the pump port 178 with respect to the central axis of the substrate support pedestal 114 as described in FIG. 2A. The gas injection funnel 142 provides the process gas at uneven flow rates to the substrate 110. For example, and independent of the position of gas injection funnel 142 with respect to the pump port 178, the gas injection funnel 142 provides a higher flow rate of the process gas to a portion of the substrate 110 disposed directly below the gas injection funnel 142. The higher flow rate may result in increase deposition (i.e., a singularity point) of the process gas on the portion of the substrate 110 located directly below the gas injection funnel 142 as compared with any portion of the substrate 110 peripheral to the gas injection funnel 142. By purposefully offsetting the gas injection funnel 142 from the central axis of the substrate support pedestal 114 and away from the pumping port 178, the singularity point may be shifted to the peripheral edge of the substrate 110 and the process gas may be more uniformly distributed across the surface of the substrate 110.

The gas injection funnel 142 is configured to provide one or more process gas from the gas sources 146, 147 as depicted in FIG. 1. For example, in a process such as an atomic layer deposition (ALD) process, a first process gas may be provided from the gas source 146 via the gas injection funnel 142 and deposited on the substrate 110 to at least partially form a layer. A second gas may be provided from the gas source 147 via the gas injection funnel 142 and deposited on the substrate 110 to at least partially form the layer, wherein the layer comprising materials from the first and second process gases. In some embodiments, the first and second process gases are supplied simultaneously via the gas injection funnel 142 and deposited on the substrate 110 to form the layer.

In some embodiments, the gas injection funnel 142 may provide carrier gases or inert gases to the inner volume via the gas injection funnel 142. The carrier gases may be provided, for example, in combination with a process gas to dilute concentration of the process gas, improve chamber pressure or the like. The carrier gas can be provided continuously during a deposition process, or in combination with a process gas as discussed. The inert gas may be provided, for example, as part of the purging step of an ALD process, or may be provided continuously for purging.

At 308, and optionally, the substrate 110 may be rotated about a central axis by way of rotating the substrate support pedestal 114 about a central axis. The rotation of the substrate 110 may be provided during the deposition of a process gas via the gas inlet funnel 142. The rotation may facilitate the uniform distribution of the process gas across the surface of the substrate 110.

At 310, a layer may be at least partially formed on the substrate 110. In some embodiments, and as described above, by a cyclic deposition process, such as the ALD process. The pulsing of the first process gas followed by a time delay and pulsing of the second process gas comprise a deposition cycle. A cycle can start with either the first process gas or the second process gas.

In some embodiments, during the time delay, a purge gas, such as nitrogen is provided into the process chamber 100 via the gas injection funnel 142. In some embodiments, the purge gas may flow continuously throughout the deposition process so that only the purge gas is provided in the chamber during the time delay between the pulses of the first process gas and the second process gas. A "pulse" as used herein is intended to refer to a quantity of a particular compound that is intermittently or non-continuously introduced into a reaction zone of a processing chamber.

After each deposition cycle, a layer having a particular thickness will be deposited on the substrate surface. Depending on specific device requirements, subsequent deposition cycles may be needed to obtain a desired thickness. As such, a deposition cycle can be repeated until the desired thickness is achieved.

Methods and apparatus for processing a substrate have been provided herein. The azimuthally non-uniform pumping proximate a surface of the substrate support pedestal may be compensated for by offsetting the gas injection funnel from the central axis of the substrate support pedestal and in a region of low pressure. The methods and apparatus facilitate improved uniformity in deposited layers on the surface of a substrate.

While the foregoing is directed to embodiments of the present invention, other and further embodiments of the invention may be devised without departing from the basic scope thereof.

The invention claimed is:

1. A method of depositing a layer of material on a substrate, comprising:
providing a substrate to a substrate support pedestal disposed in an inner volume of a process chamber having one or more pump ports disposed off-center from a central axis of the substrate support pedestal, wherein the one or more pump ports provide azimuthally non uniform pumping proximate a surface of the substrate support pedestal to create localized regions of high pressure and low pressure within the inner volume, wherein the process chamber further comprises one or more gas injection funnels disposed through a ceiling of the process chamber and directly opposite the substrate support pedestal, and wherein the each gas injection funnel is offset from the central axis of the substrate support pedestal and is disposed in a region of low pressure; and
providing a first process gas to the inner volume via the one or more gas injection funnels to at least partially form a layer on the substrate.

2. The method of claim 1, further comprising:
rotating the substrate support pedestal about a central axis while providing the first process gas.

3. The method of claim 1, further comprising:
providing a second process gas to the inner volume via the one or more gas injection funnels, wherein the second process gas at least partially forms the layer on the substrate.

4. The method of claim 3, further comprising:
rotating the substrate support pedestal about a central axis while providing the second process gas.

5. The method of claim 3, wherein the steps of providing the first process gas and providing the second process gas do not overlap.

6. The method of claim 5, wherein the steps of providing the first process gas and providing the second process gas are repeated to form the layer to a desired thickness.

7. The method of claim 3, wherein providing the second process gas further comprises:
providing the second process gas to the inner volume via a second gas injection funnel disposed in the ceiling of the chamber body opposite the substrate support pedestal, wherein the second gas injection funnel is offset from the central axis of the substrate support pedestal and disposed in a region of low pressure.

8. The method of claim 1, wherein the one or more gas injection funnels is one gas injection funnel, and wherein the one or more pump ports comprises one pump port disposed on an opposite side of the central axis of the substrate support pedestal with respect to the gas injection funnel, and wherein the substrate support pedestal, the gas injection funnel, and the one pump port each have central axes disposed in a common plane.

9. A non-transitory computer readable medium having instructions stored thereon that, when executed, cause a process chamber to perform a method of depositing a layer of material on a substrate, the method comprising:
providing a substrate to a substrate support pedestal disposed in an inner volume of a process chamber having one or more pump ports disposed off-center from a central axis of the substrate support pedestal, wherein the one or more pump ports provide azimuthally non uniform pumping proximate a surface of the substrate support pedestal to create localized regions of high pressure and low pressure within the inner volume, wherein the process chamber further comprises one or more gas injection funnels disposed through a ceiling of the process chamber and directly opposite the substrate support pedestal, and wherein each gas injection funnel is offset from the central axis of the substrate support pedestal and is disposed in a region of low pressure; and
providing a first process gas to the inner volume via the one or more gas injection funnels to at least partially form a layer on the substrate.

10. The computer readable medium of claim 9, further comprising:

rotating the substrate support pedestal about a central axis while providing the first process gas.

11. The computer readable medium of claim 9, further comprising:
providing a second process gas to the inner volume via the one or more gas injection funnels, wherein the second process gas at least partially forms the layer on the substrate.

12. The computer readable medium of claim 11, further comprising:
rotating the substrate support pedestal about the central axis while providing the second process gas.

13. The computer readable medium of claim 11, wherein the steps of providing the first process gas and providing the second process gas do not overlap.

14. The computer readable medium of claim 13, wherein the steps of providing the first process gas and providing the second process gas are repeated to form the layer to a desired thickness.

15. The computer readable medium of claim 11, wherein providing the second process gas further comprises:
providing the second process gas to the inner volume via a second gas injection funnel disposed in the ceiling of the process chamber opposite the substrate support pedestal, wherein the second gas injection funnel is offset from the central axis of the substrate support pedestal and is disposed in a region of low pressure.

16. The method of claim 1, wherein the one or more gas injection funnels comprises two gas injection funnels, wherein the central axis of each of a first pump port and the substrate support pedestal are disposed in a common plane and the two gas injection funnels are disposed on opposing sides of the common plane, and wherein the first pump port is disposed opposite the two gas injection funnels with respect to the central axis of the substrate support pedestal.

17. The method of claim 1, wherein the one or more gas injection funnels comprises one gas injection funnel, wherein the one or more pump ports consist of a first pump port and a second pump port, wherein central axes of the first pump port the second pump port are disposed in a first plane and a central axis of the gas injection funnel is disposed in a second plane perpendicular to the first plane, wherein the first pump port and the second pump port are disposed opposite each other with respect to the central axis of the substrate support pedestal, and wherein the gas injection funnel is disposed substantially equidistant from the first pump port and the second pump port.

18. The method of claim 1, wherein the one or more gas injection funnels consists of a first gas injection funnel and a second gas injection funnel, wherein the one or more pump ports consist of a first pump port and a second pump port, wherein the first pump port and the second pump port are disposed opposite each other with respect to the central axis of the substrate support pedestal, wherein central axes of the first pump port the second pump port are disposed in a first plane and a central axis of the first gas injection funnel is disposed in a second plane perpendicular to the first plane, wherein the second gas injection funnel is disposed on an opposite side of the first plane with respect to the first gas injection funnel, wherein a central axis of the second gas injection funnel is disposed in the second plane, and wherein the first and second gas injection funnels are disposed substantially equidistant from the first pump port and the second pump port.

* * * * *